US009269727B2

(12) United States Patent
Im et al.

(10) Patent No.: US 9,269,727 B2
(45) Date of Patent: Feb. 23, 2016

(54) CURVED DISPLAY DEVICE INCLUDING TRENCHES IN SUBSTRATE

(71) Applicant: Samsung Display Co., Ltd., Yongin, Gyeonggi-Do (KR)

(72) Inventors: Wan-Soon Im, Cheonan-si (KR); SuWan Woo, Osan-si (KR)

(73) Assignee: SAMSUNG DISPLAY CO., LTD. (KR)

( * ) Notice: Subject to any disclaimer, the term of this patent is extended or adjusted under 35 U.S.C. 154(b) by 0 days.

(21) Appl. No.: 14/590,103

(22) Filed: Jan. 6, 2015

(65) Prior Publication Data
US 2015/0236045 A1    Aug. 20, 2015

(30) Foreign Application Priority Data
Feb. 18, 2014   (KR) .................. 10-2014-0018591

(51) Int. Cl.
| H01L 27/32 | (2006.01) |
| G02F 1/1368 | (2006.01) |
| G02F 1/1333 | (2006.01) |
| G02F 1/1335 | (2006.01) |
| G02F 1/1362 | (2006.01) |
| H01L 27/12 | (2006.01) |
| H01L 51/52 | (2006.01) |

(52) U.S. Cl.
CPC ............ *H01L 27/124* (2013.01); *G02F 1/1333* (2013.01); *G02F 1/1368* (2013.01); *G02F 1/133512* (2013.01); *G02F 1/136286* (2013.01); *H01L 27/1218* (2013.01); *H01L 27/3272* (2013.01); *H01L 27/3276* (2013.01); *G02F 2001/133302* (2013.01); *H01L 51/52* (2013.01); *H01L 51/524* (2013.01); *H01L 2251/5338* (2013.01)

(58) Field of Classification Search
None
See application file for complete search history.

(56) References Cited

U.S. PATENT DOCUMENTS

| 5,963,281 A | 10/1999 | Koons et al. |
| 6,042,926 A | 3/2000 | Tanaka et al. |
| 6,052,165 A | 4/2000 | Janssen |
| 7,242,398 B2 * | 7/2007 | Nathan et al. .................. 345/206 |
| 7,786,479 B2 | 8/2010 | Wang et al. |
| 7,847,912 B2 * | 12/2010 | Nishizawa et al. ........... 349/160 |
| 8,216,891 B2 | 7/2012 | Wang et al. |
| 8,294,869 B2 * | 10/2012 | Yamaguchi et al. .......... 349/160 |
| 2005/0164592 A1 | 7/2005 | Lee |
| 2007/0058114 A1 | 3/2007 | Niiyama et al. |
| 2007/0096208 A1 | 5/2007 | Lee et al. |
| 2008/0218369 A1 * | 9/2008 | Krans et al. ................. 340/691.1 |
| 2008/0305576 A1 | 12/2008 | Yu et al. |
| 2012/0020056 A1 | 1/2012 | Yamagata et al. |

FOREIGN PATENT DOCUMENTS

| JP | 2006-106079 A | 4/2006 |
| JP | 2007-140132 A | 6/2007 |
| JP | 2010-097028 A | 4/2010 |
| JP | 2010-156784 A | 7/2010 |
| JP | 2012051777 A * | 3/2012 |
| KR | 1020070121414 A | 12/2007 |

* cited by examiner

*Primary Examiner* — Joseph Schoenholtz
(74) *Attorney, Agent, or Firm* — Cantor Colburn LLP

(57) ABSTRACT

A curved display device includes a first substrate, a pixels and a second substrate. The first substrate is curved along a first direction and includes a pixel area through which light is transmitted and a non-pixel area which blocks light transmission therethrough. The pixel is disposed in the pixel area. The second substrate is curved along the first direction, and is opposite to and coupled to the first substrate. First trenches are defined in at least one substrate among the first and second substrates and extending in a second direction intersecting the first direction.

19 Claims, 13 Drawing Sheets

CURVED DISPLAY DEVICE INCLUDING TRENCHES IN SUBSTRATE

This application claims priority to Korean Patent Application No. 10-2014-0018591, filed on Feb. 18, 2014, and all the benefits accruing therefrom under 35 U.S.C. §119, the disclosure of which is hereby incorporated by reference in its entirety.

BACKGROUND

The invention relates to a curved display device. More particularly, the invention relates to a curved display device including a curved display area.

Flat display devices, such as a liquid crystal display device and an organic electroluminescence display device, have been used in order to display an image in a variety of information processing devices, such as a television, a monitor, a notebook and a portable phone.

A curved display device including the flat display device has been developed. The curved display device includes a display area having a curved shape to provide an image with improved three-dimensional effect, immersion effect and presence effect to users.

SUMMARY

One or more exemplary embodiment of the invention provides a curved display device having improved display quality.

One or more exemplary embodiment of the invention provides a curved display device including a first substrate, a pixel and a second substrate. The first substrate is curved along a first direction, and includes a pixel area through which light is transmitted and a non-pixel area which blocks light transmission therethrough. The pixel is in the pixel area. The second substrate is curved along the first direction, and is opposite to and coupled to the first substrate. First trenches are defined in one substrate among the first and second substrates, and extending in a second direction intersecting the first direction.

In an exemplary embodiment, the first and second substrates may be curved along the first direction and the second direction. At least one substrate among the first and second glass substrates may have second trenches defined in the one substrate among the first and second substrates, and extending in a direction intersecting the second direction.

BRIEF DESCRIPTION OF THE DRAWINGS

The above and other features of this disclosure will become more apparent in view of the attached drawings and accompanying detailed description, in which.

DETAILED DESCRIPTION

Figure 1A:
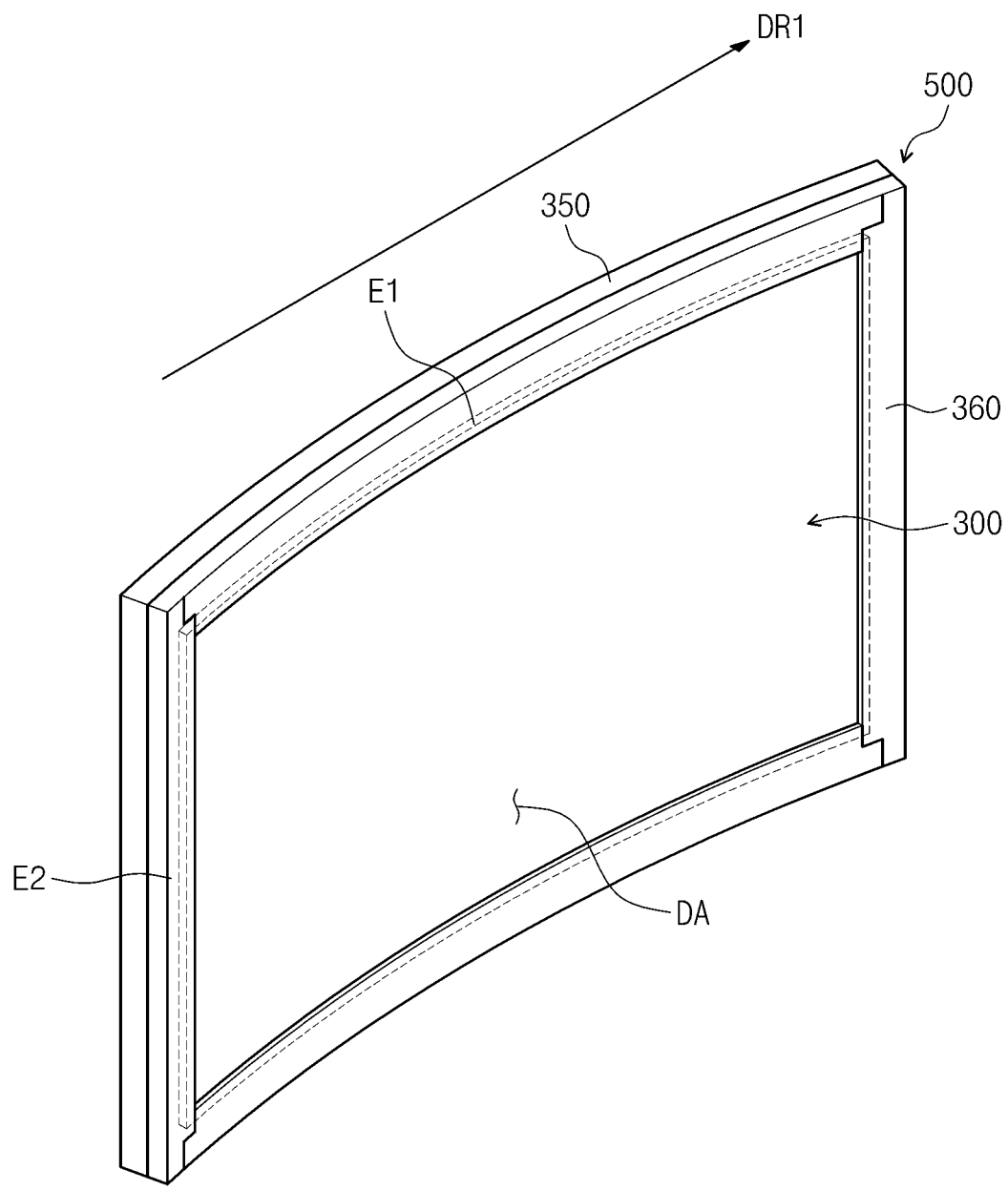
FIG. 1A is a perspective view of an exemplary embodiment of a curved display device according to the invention.

The inventions will now be described more fully hereinafter with reference to the accompanying drawings, in which exemplary embodiments of the invention are shown. The advantages and features of the invention and methods of achieving them will be apparent from the following exemplary embodiments that will be described in more detail with reference to the accompanying drawings. It should be noted, however, that the invention is not limited to the following exemplary embodiments, and may be implemented in various forms. Accordingly, the exemplary embodiments are provided only to disclose the invention and let those skilled in the art know the category of the invention. In the drawings, exemplary embodiments of the invention are not limited to the specific examples provided herein and are exaggerated for clarity.

The terminology used herein is for the purpose of describing particular embodiments only and is not intended to limit the invention. As used herein, the singular terms "a," "an" and "the" are intended to include the plural forms as well, unless the context clearly indicates otherwise. As used herein, the term "and/or" includes any and all combinations of one or more of the associated listed items. It will be understood that when an element is referred to as being "connected" or "coupled" to another element, it may be directly connected or coupled to the other element or intervening elements may be present. As used herein, connected may refer to elements being physically and/or electrically connected to each other.

Similarly, it will be understood that when an element such as a layer, region or substrate is referred to as being "on" another element, it can be directly on the other element or intervening elements may be present. In contrast, the term "directly" means that there are no intervening elements. It will be further understood that the terms "comprises," "comprising," "includes" and/or "including" when used herein, specify the presence of stated features, integers, steps, operations, elements and/or components, but do not preclude the presence or addition of one or more other features, integers, steps, operations, elements, components, and/or groups thereof.

Spatially relative terms, such as "below," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" relative to other elements or features would then be oriented "above" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

Additionally, the exemplary embodiments in the detailed description will be described with sectional views as ideal exemplary views of the invention. Accordingly, shapes of the exemplary views may be modified according to manufacturing techniques and/or allowable errors. Therefore, the embodiments of the invention are not limited to the specific shape illustrated in the exemplary views, but may include other shapes that may be created according to manufacturing processes. Areas exemplified in the drawings have general properties, and are used to illustrate specific shapes of elements. Thus, this should not be construed as limited to the scope of the invention.

It will be also understood that although the terms first, second, third etc. may be used herein to describe various elements, these elements should not be limited by these terms. These terms are only used to distinguish one element from another element. Thus, a first element in some exemplary embodiments could be termed a second element in other exemplary embodiments without departing from the teachings of the invention. Exemplary embodiments of the invention explained and illustrated herein include their complementary counterparts. The same reference numerals or the same reference designators denote the same elements throughout the specification.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be described in detail with reference to the accompanying drawings.

Figure 1B:
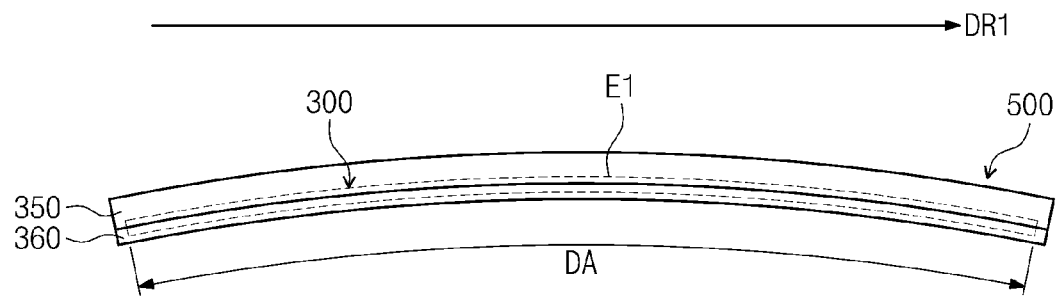
FIG. 1B is a cross-sectional view of the curved display device shown in FIG. 1A.
Figure 1C:
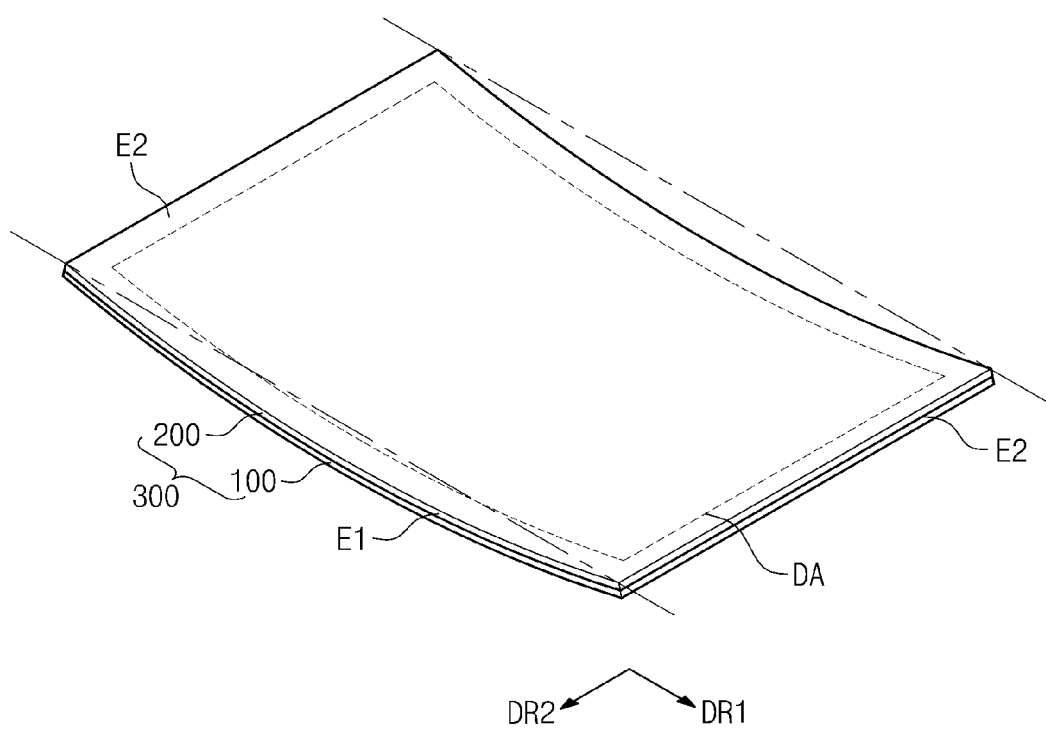
FIG. 1C is a perspective view showing an exemplary embodiment of a display panel included in the curved display device of FIG. 1A.

FIG. 1A is a perspective view of an exemplary embodiment of a curved display device according to the invention. FIG. 1B is a cross-sectional view of the curved display device shown in FIG. 1A. FIG. 1C is a perspective view showing an exemplary embodiment of a display panel included in the curved display device of FIG. 1A.

Referring to FIGS. 1A, 1B and 1C, a curved display device 500 includes a receiving member 350, a display panel 300 and a cover member 360. In the illustrated exemplary embodiment, the display panel 300 may be a liquid crystal display panel. Where the display panel 300 is a liquid crystal display panel, the curved display device 500 may further include a backlight unit (not shown) received in the receiving member 350. The backlight unit generates and outputs light to the display panel 300. The display panel 300 is provided with the light to display an image through a display area DA thereof. The display area DA includes a pixel area PA through which light is transmitted, and a non-pixel area N-PA which blocks light transmittance therethrough.

In the illustrated exemplary embodiment, the curved display device 500 has a curved shape. In more detail, the curved display device 500 has a shape curved along a first direction DR1. Where the curved display device 500 has a shape curved along the first direction DR1, the display panel 300 has a shape curved along the first direction DR1 to correspond to the curved shape of the curved display device 500. The display panel 300 has a long side E1 and a short side E2. Where the curved display panel 300 has a shape curved along the first direction DR1, the long side E1 of the display panel 300 has a shape curved along the first direction DR1. In FIG. 1C, a dotted line at long sides E1 of the display panel 300 indicates a location at which the long sides E1 may be disposed for a flat display panel 300, however, since the display panel 300 is curved in FIG. 1C, the long sides E1 are deviated from the dotted line positions.

Figure 2:
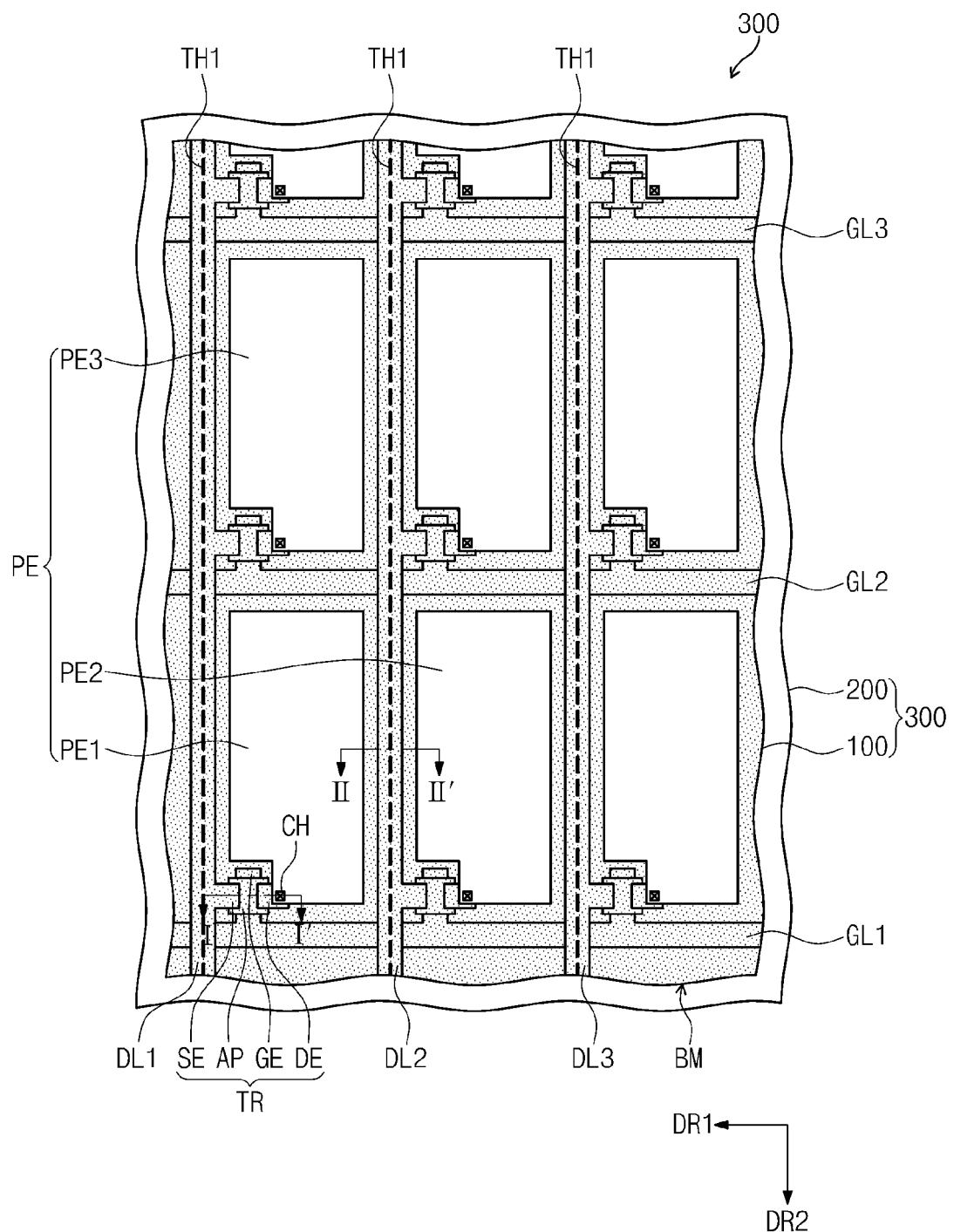
FIG. 2 is an enlarged plan view of an exemplary embodiment of pixels included in the display panel of FIG. 1C.
Figure 3A:
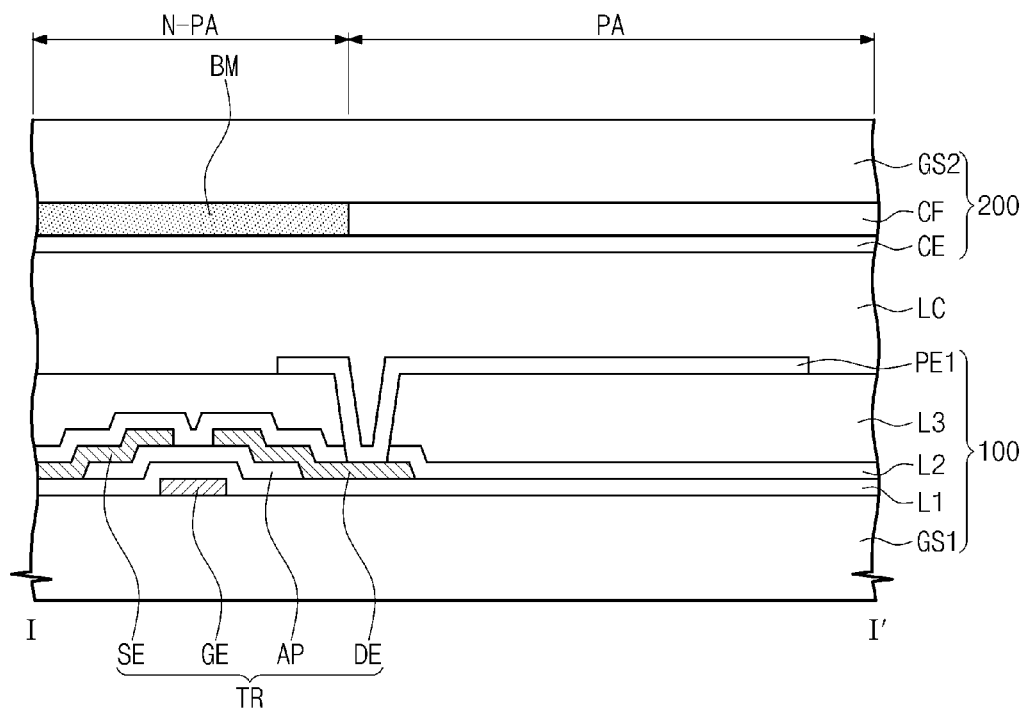
FIG. 3A is a cross-sectional view taken along line I-I' of FIG. 2.
Figure 3B:
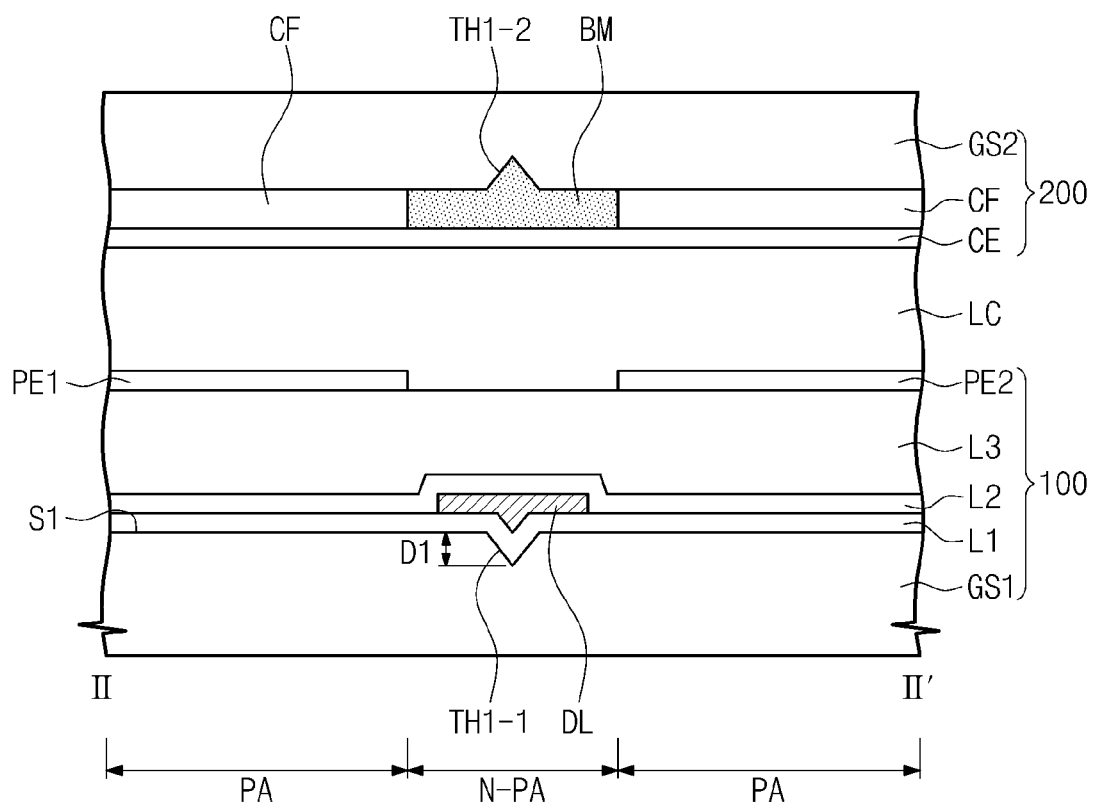
FIG. 3B is a cross-sectional view taken along line II-II' of FIG. 2.

Referring to FIG. 3A and FIG. 3B, the display panel 300 may include a first glass substrate GS1 of and a second glass substrate GS2 of FIG. 2 that face each other and are coupled with each other. The first and second glass substrates include a transparent and relatively hard or rigid material such as glass. However, in the illustrated exemplary embodiment, a size (e.g., 46 inches or 55 inches) of the display panel 300 may be greater than a size of a display panel applied to a portable display device, and a thickness of each of the first and second glass substrates may be several millimeters (mm) or less. Thus, the display panel 300 may be curved in the first direction DR1 with a radius of curvature of about 2 meters to about 10 meters.

As described above, where the display panel 300 has the curved shape, the display area DA of the display panel 300 may also have the curved shape. Thus, the curved display device 500 may display the image with improved three-dimensional effect, immersion effect and presence effect through the display area DA.

The receiving member 350 receives the display panel 300, and the cover member 360 is coupled with the receiving member 350 including the display panel 300 received therein. The cover member 360 covers an edge portion of the display panel 300. In addition, an opening may be defined in the cover member 360 corresponding to the display area DA of the display panel 300 to expose the display region DA. Each of the cover member 360 and the receiving member 350 may be curved to correspond to the shape of the display panel 300, so the curved shape of the display panel 300 may be maintained.

FIG. 2 is an enlarged plan view of an exemplary embodiment of pixels included in the display panel of FIG. 1C. FIG. 3A is a cross-sectional view taken along line I-I' of FIG. 2. FIG. 3B is a cross-sectional view taken along line II-II' of FIG. 2. The display panel 300 includes a plurality of pixels disposed in the display region DA of FIG. 1C. FIG. 2 shows a portion of the plurality of pixels disposed in the display region DA of FIG. 1C. The plurality of pixels disposed in the display region DA of FIG. 1C may have the same structure or similar structures to each other. Thus, descriptions to pixels other than those illustrated in FIG. 2 will be omitted.

Referring to FIGS. 2 and 3A, the display panel 300 includes a display substrate 100, an opposite substrate 200, and a liquid crystal layer LC disposed between the display substrate 100 and the opposite substrate 200.

The display substrate 100 includes the first glass substrate GS1, a plurality of gate lines such as first to third gate lines GL1, GL2 and GL3, a plurality of data lines DL such as first to third data lines DL1, DL2 and DL3, a plurality of thin film transistors TR, and a plurality of pixel electrodes PE.

The first glass substrate GS1 includes a glass material. As described above, the first glass substrate GS1 has the shape curved along the first direction DR1. Each of the first to third gate lines GL1, GL2 and GL3 may extend in the first direction DR1. Each of the first to third data lines DL1, DL2 and DL3 may extend in a second direction DR2 perpendicular to the first direction DR1.

In the illustrated exemplary embodiment, the plurality of thin film transistors TR may be disposed at crossing points of the first to third gate lines GL1, GL2 and GL3 and the first to third data lines DL1, DL2 and DL3 in one-to-one correspondence, and the plurality of pixel electrodes PE may be electrically connected to the plurality of thin film transistors TR in one-to-one correspondence.

However, the invention is not limited to the structures of the gate lines GL1, GL2 and GL3, the structures of the data lines DL1, DL2 and DL3, the structures of the thin film transistors TR, and the structures of the pixel electrodes PE illustrated herein. In other exemplary embodiments, each of the pixel electrodes PE may include two sub-pixel electrodes. The two sub-pixel electrodes may be electrically connected to data lines different from each other, so data signals different from each other may be applied to the two sub-pixel electrodes.

The first gate line GL1 and one thin film transistor TR electrically connected to the first gate line GL1 will be described hereinafter.

The thin film transistor TR may be disposed in the non-pixel area N-PA. The thin film transistor TR may include a gate electrode GE, an active pattern AP, a source electrode SE and a drain electrode DE.

The gate electrode GE may diverge from a main portion of the first gate electrode GL1 and may be disposed on the first glass substrate GS1. The active pattern AP may be disposed on the gate electrode GE, with a first insulating layer L1 therebetween. The source electrode SE may diverge from a main portion of the first data line DL1 and may be disposed on the active pattern AP. The drain electrode DE may be on the active pattern AP and spaced apart from the source electrode SE. A portion of the active pattern AP may be exposed by the spaced apart source and drain electrodes SE and DE.

In the illustrated exemplary embodiment, the active pattern AP may include a semiconductor material such as amorphous silicon. However, the invention is not limited to the above-described semiconductor material of the active pattern AP. In other exemplary embodiments, the active pattern AP may include at least one of an oxide semiconductor such as indium gallium zinc oxide ("IGZO"), ZnO, $SnO_2$, $In_2O_3$, $Zn_2SnO_4$, $Ge_2O_3$ and $HfO_2$. In still other exemplary embodiments, the active pattern AP may include at least one of a compound semiconductor such as GaAs, GaP and InP.

A first pixel electrode PE1 among the pixel electrodes PE will be described as an example. The first pixel electrode PE1 may be disposed in the pixel area PA and may be electrically connected to the thin film transistor TR. In more detail, the first pixel electrode PE1 is disposed on a second insulating layer L2 and a third insulating layer L3 that cover the thin film transistor TR. The first pixel electrode PE1 is electrically connected to the drain electrode DE of the thin film transistor TR through a contact hole CH penetrating the second and third insulating layers L2 and L3.

The opposite substrate 200 may include the second glass substrate GS2, a light blocking layer BM, a color filter CF and a common electrode CE. The second glass substrate GS2 includes a glass material. The second glass substrate GS2 has a curved shape along the first direction DR1 similar to that of the first glass substrate GS1.

The light blocking layer BM is disposed on the second glass substrate GS2 to correspond to the non-pixel area N-PA, and the color filter CF is disposed on the second glass substrate GS2 to correspond to the pixel area PA. The common electrode CE is disposed on the second glass substrate GS2 to cover the light blocking layer BM and the color filter CF. The common electrode CE and the pixel electrodes PE are configured to generate an electric field therebetween, which controls directors of liquid crystal molecules of the liquid crystal layer LC.

However, the invention is not limited to the aforementioned structures of the light blocking layer BM, the color filter CF and the common electrode CE. In other exemplary embodiments, the color filter CF may be disposed on the first glass substrate GS1 to correspond to the pixel area PA, and the light blocking layer BM may be disposed on the first glass substrate GS1 to correspond to the non-pixel area N-PA. The common electrode CE may be disposed on the first glass substrate GS1 but spaced apart from the pixel electrodes PE.

In the illustrated exemplary embodiment, first trenches TH1 may be defined in the first glass substrate GS1 and the second glass substrate GS2. The first trenches TH1 may be disposed in the non-pixel area N-PA and may overlap with the light blocking layer BM. Thus, even though light transmitted through the first or second glass substrate GS1 or GS2 is scattered by an inclined plane defining each of the first trenches TH1, the scattered light is blocked by the light blocking layer BM, so that deterioration of a display quality of the display panel 300 by the scattered light may be reduced or effectively prevented.

Where each of the first and second glass substrates GS1 and GS2 are curved along the first direction DR1 as described above, each of the first trenches TH1 may extend in a direction intersecting the first direction DR1. In the illustrated exemplary embodiment, each of the first trenches TH1 may extend in the second direction DR2 perpendicular to the first direction DR1.

In the illustrated exemplary embodiment, the first trenches TH1 may include first sub-trenches TH1-1 defined in the first glass substrate GS1 and second sub-trenches TH1-2 defined in the second glass substrate GS2. The first sub-trenches TH1-1 may disperse or relieve stress that is applied to the first glass substrate GS1 owing to the curved shape of the first glass substrate GS1. Likewise, the second sub-trenches TH1-2 may disperse or relieve stress that is applied to the second glass substrate GS2 owing to the curved shape of the second glass substrate GS2. As a result, the display quality of the display panel 300 may be improved. This will be described using the first sub-trenches TH1-1 as an example in more detail hereinafter. In a conventional curved display device, if the first sub-trenches TH1-1 are not defined in a first glass substrate, unlike the exemplary embodiments of the invention, stress may be locally applied to the first glass substrate owing to the curved shape of the first glass substrate. When light is transmitted through a portion of the first glass substrate to which the stress is locally applied, a refractive index of the light may be varied according to a travelling direction of the light to cause retardation of a phase of the light. If the first glass substrate is not curved, the first glass substrate generally has transparent and non-optical characteristics. In contrast, where the first glass substrate is curved, the phase retardation of the light may occur to cause deterioration of the display quality of the conventional curved display device, e.g., a light leakage phenomenon.

However, in one or more exemplary embodiment according to the invention, the first sub-trenches TH1-1 may be defined in the first glass substrate GS1 to disperse or relieve the stress locally applied to the first glass substrate GS1, so that phase retardation of the light transmitted through the first glass substrate GS1 may be reduced or effectively prevented. As a result, the transparent and non-optical characteristics of the first glass substrate GS1 may be maintained in a curved display device.

Since the first and second sub-trenches TH1-1 and TH1-2 have substantially the same structure or similar structures to each other, repeated descriptions will be omitted for the purpose of ease and convenience in explanation.

In the illustrated exemplary, the first trenches TH1 may overlap with the first to third data lines DL1, DL2 and DL3 as well as the light blocking layer BM. In an exemplary embodiment, for example, the first trenches TH1 may overlap with the first to third data lines DL1, DL2 and DL3 in one-to-one correspondence, as illustrated in FIG. 2. Where the first trenches TH1 overlap with the first to third data lines DL1, DL2 and DL3 in one-to-one correspondence, a first pitch of the first trenches TH1 may be similar to a second pitch of the first to third data lines DL1, DL2 and DL3. In other exemplary embodiments, the first pitch may be greater than the second pitch. In an exemplary embodiment, for example, the first pitch may be several times to tens of times greater than the second pitch. The first and second pitches may be defined as a distance between adjacent data lines and a distance between adjacent trenches, taken from common references points thereof and in a direction perpendicular to extension directions thereof.

In the illustrated exemplary embodiment, an interface of the first glass substrate GS1 and the first insulating layer L1 contacting each other is defined as an inner surface S1. In an exemplary embodiment of manufacturing a curved display device, a portion of the first glass substrate GS1 may be partially removed at the inner surface S1 to form each of the first sub-trenches TH1-1. The first sub-trench TH1-1 has a first depth D1 taken from the inner surface S1. The first depth D1 may be in a range of about 10% to about 50% of a cross-sectional thickness of the first glass substrate GS1. In an exemplary embodiment, for example, if the cross-sectional thickness of the first glass substrate GS1 is about 1 mm, the first depth D1 may be in a range of about 0.1 mm to about 0.5 mm.

In the illustrated exemplary embodiment, the first trenches TH1 include the first and second sub-trenches TH1-1 and TH1-2. However, the invention is not limited thereto. In other exemplary embodiments, the first trenches TH1 may include only the first sub-trenches TH1-1 defined in the first glass substrate GS1 or the second sub-trenches TH1-2 defined in the second glass substrate GS2.

In other exemplary embodiments, the display panel 300 may include an organic electroluminescence display panel, and a window substrate covering the organic electroluminescence display panel. The organic electroluminescence display panel may include a base substrate and a plurality of pixels disposed on the base substrate. Each of the pixels of the organic electroluminescence display panel may include an anode, a cathode and an organic light emitting layer disposed between the anode and the cathode. Where the curved display panel 300 includes the organic electroluminescence display panel and the window substrate, as described above, a plurality of trenches TH1 may be defined in each of the base substrate and the window substrate. Thus, the stress locally applied to the base and window substrates owing to the curved shape of the display panel 300 may be dispersed or relieved by the plurality of trenches, so that phase retardation of light transmitted through the base and window substrates may be minimized or effectively prevented.

Figure 4A:
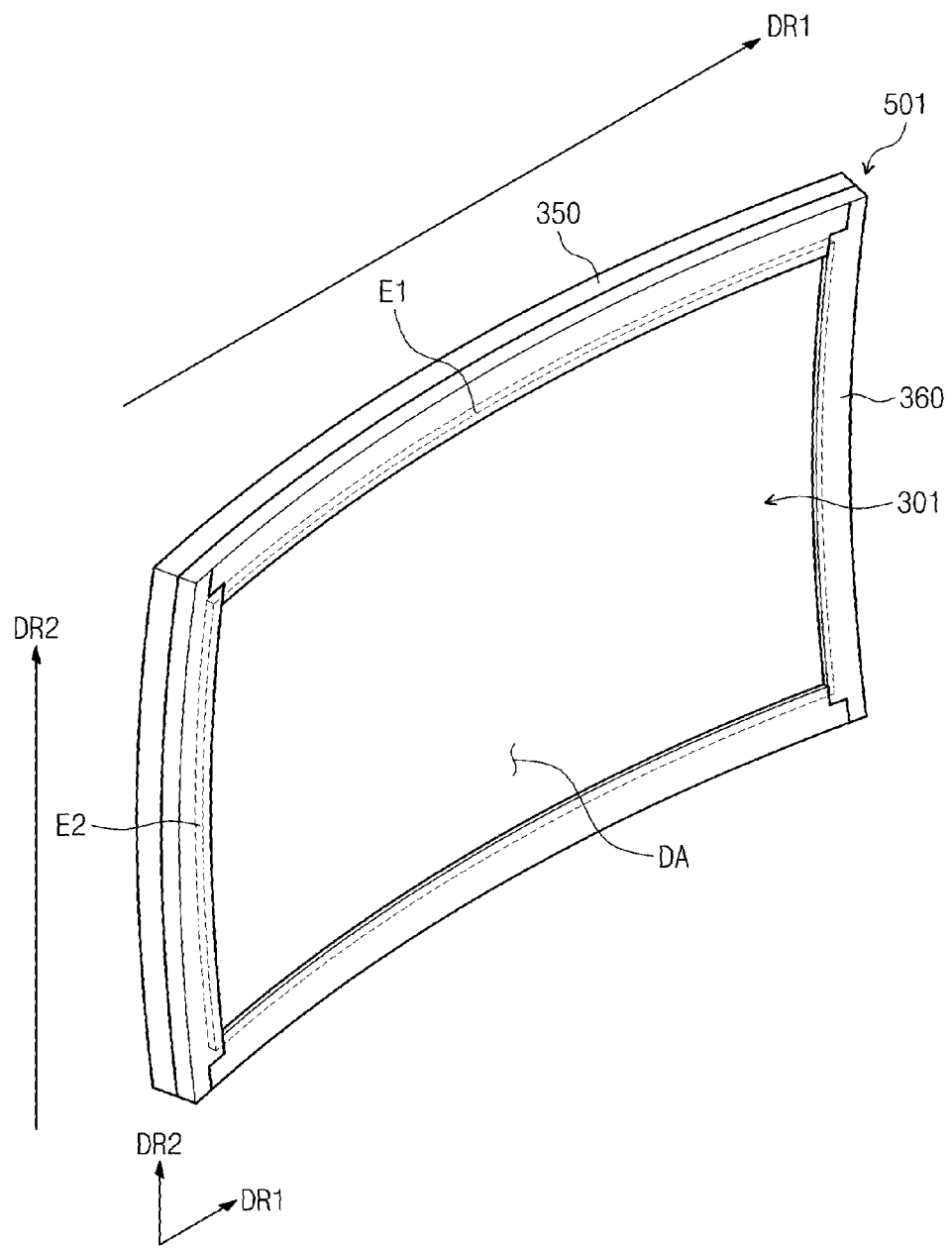
FIG. 4A is a perspective view of another exemplary embodiment of a curved display device according to the invention.
Figure 4B:
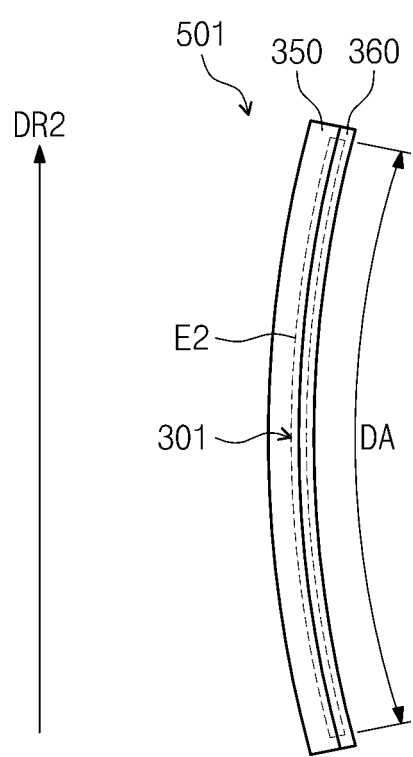
FIG. 4B is a cross-sectional side view of the curved display device shown in FIG. 4A.
Figure 4C:
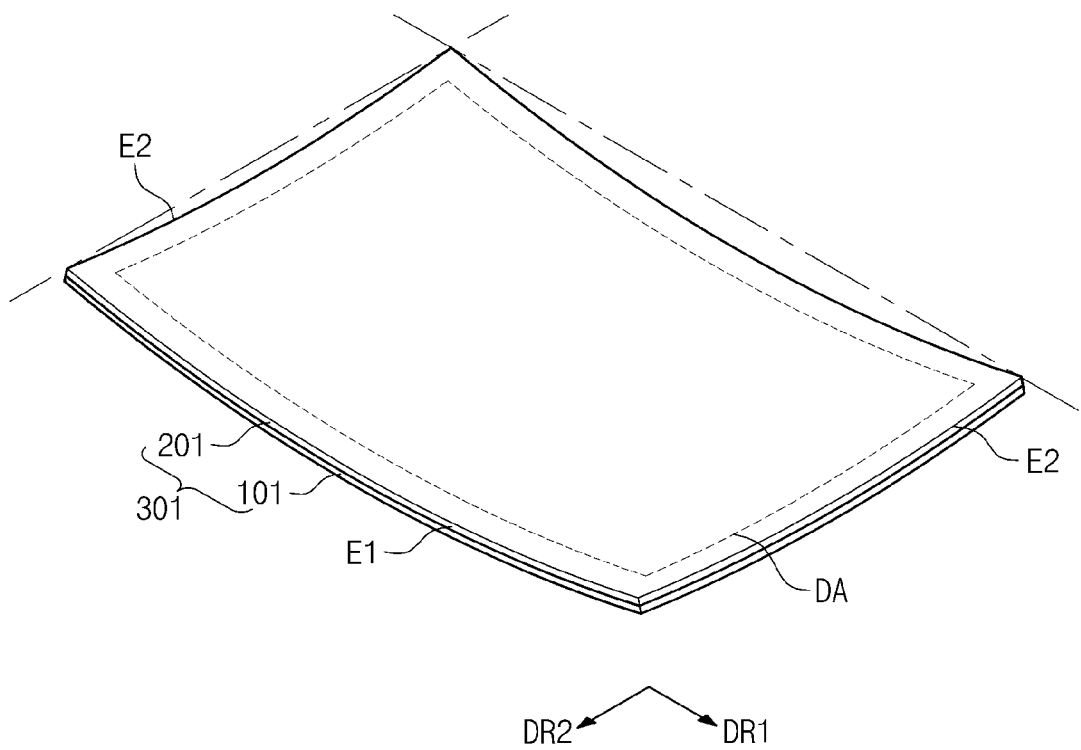
FIG. 4C is a perspective view showing an exemplary embodiment of a display panel included in the curved display device of FIG. 4A.

FIG. 4A is a perspective view of another exemplary embodiment of a curved display device according to the invention. FIG. 4B is a side view of the curved display device shown in FIG. 4A. FIG. 4C is a perspective view of an exemplary embodiment of a display panel included in the curved display device of FIG. 4A.

The curved display device 500 of FIG. 1A has the shape curved only along the first direction DR1. However, referring to FIGS. 4A, 4B, and 4C, a curved display device 501 has a shape curved along a second direction DR2 as well as the first direction DR1. A display panel 301 included in the curved display device 501 has a long side E1 and a short side E2. The long side E1 is curved along the first direction DR1, and the short side E2 is curved along the second direction DR2.

Figure 5A:
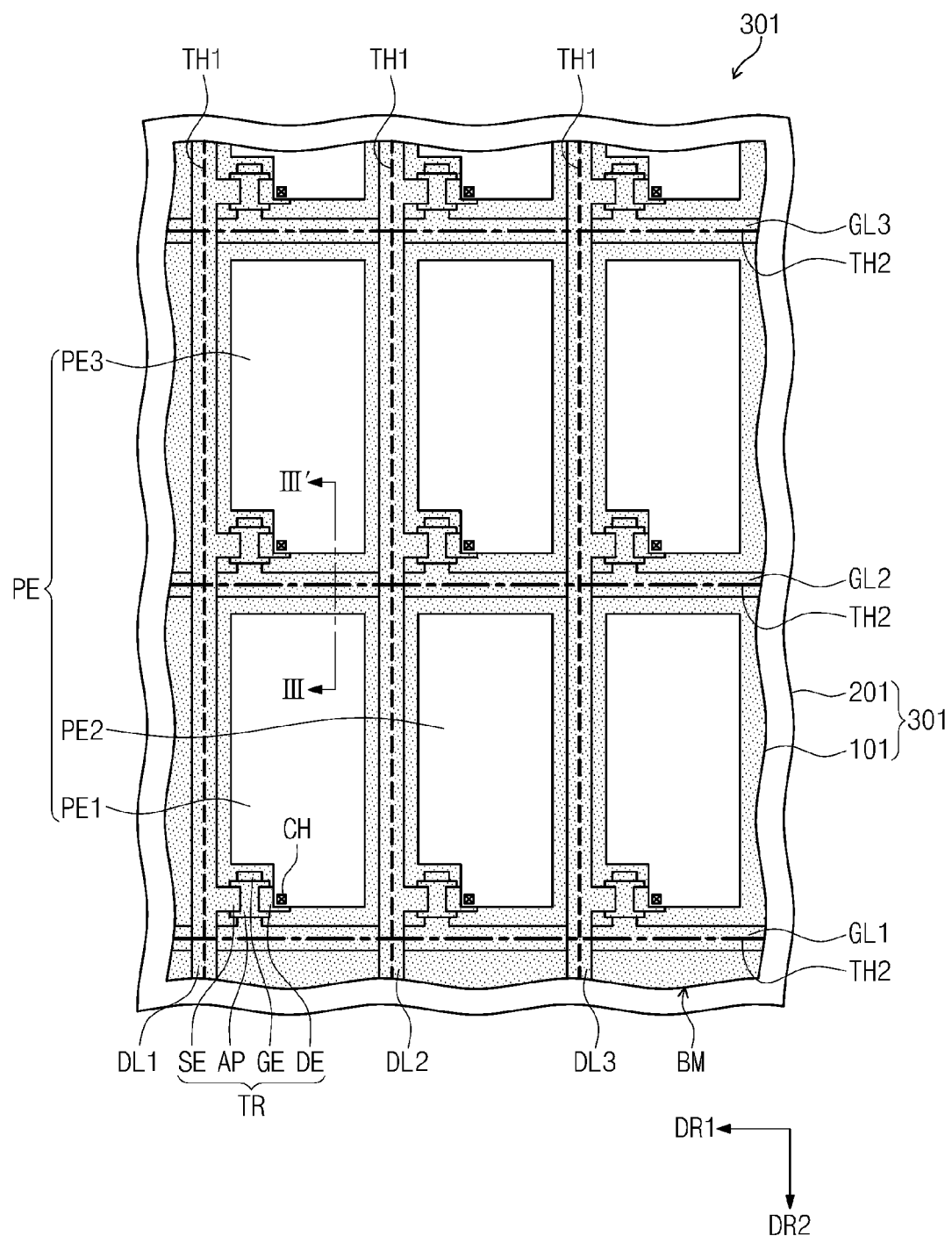
FIG. 5A is an enlarged plan view of an exemplary embodiment of pixels included in the display panel of FIG. 4C.
Figure 5B:
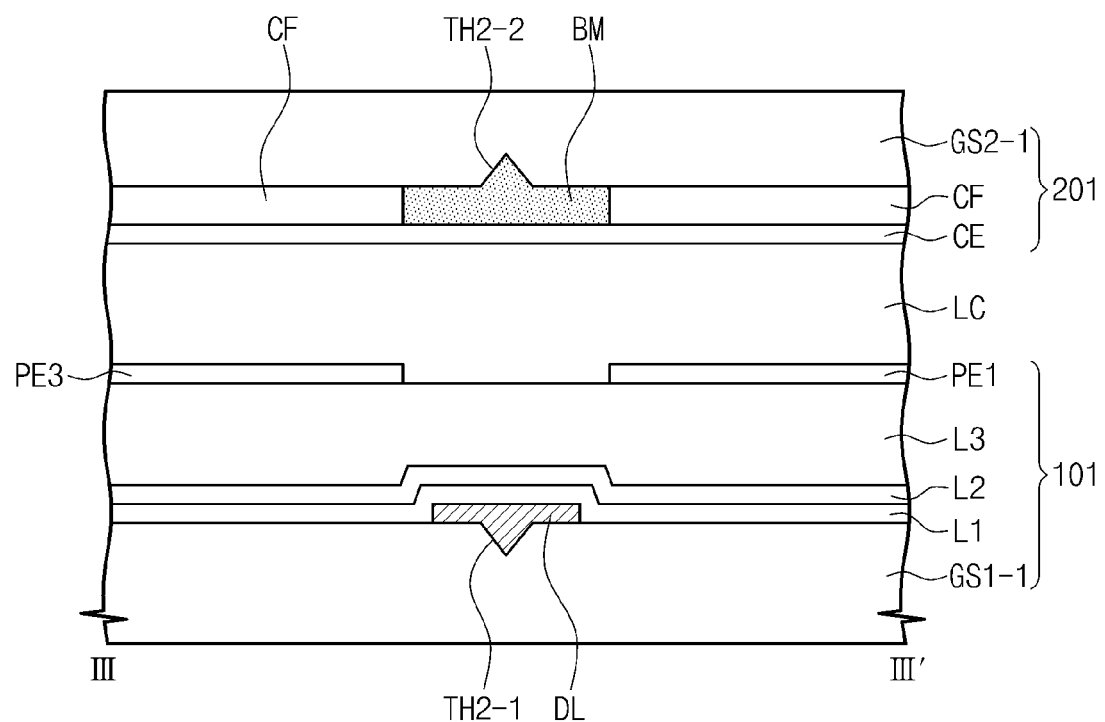
FIG. 5B is a cross-sectional view taken along line III-III' of FIG. 5A.

FIG. 5A is an enlarged plan view of an exemplary embodiment of pixels included in the display panel of FIG. 4C. FIG. 5B is a cross-sectional view taken along line III-III' of FIG. 5A. In the illustrated embodiment, the same elements as described in the aforementioned exemplary embodiments will be indicated by the same numerals or the same designators. The descriptions to the same elements as described in the aforementioned exemplary embodiments will be omitted or mentioned briefly for the purpose of ease and convenience in explanation.

Referring to FIGS. 5A and 5B, the display panel 301 includes a display substrate 101 and an opposite substrate 201. The display substrate 101 includes a first glass substrate GS1-1, and the opposite substrate 201 includes a second glass substrate GS2-1.

In the illustrated exemplary embodiment, first trenches TH1 and second trenches TH2 may be defined in each of the first and second glass substrates GS1-1 and GS2-1. Each of the second trenches TH2 may extend in a direction intersecting the second direction DR2. In the illustrated exemplary, each of the second trenches TH2 may extend in the first direction DR1 perpendicular to the second direction DR2.

The second trenches TH2 may be disposed in a non-pixel area N-PA to overlap with a light blocking layer BM. The second trenches TH2 may disperse or relieve stress that is locally applied to the first and second glass substrates GS1-1 and GS2-1 by the first and second glass substrates GS1-1 and GS2-1 being curved along the second direction DR2. As a result, phase retardation of light transmitted through the first and second glass substrates GS1-1 and GS2-1 may be minimized or effectively prevented, so the first and second glass substrates GS1-1 and GS2-1 may maintain their transparent and non-optical characteristics.

Since the first and second trenches TH1 and TH2 have substantially the same structure or similar structures to each other, repeated descriptions will be omitted for the purpose of ease and convenience in explanation.

In the illustrated exemplary embodiment, the second trenches TH2 may overlap with the first to third gate lines GL1, GL2 and GL3 as well as the light blocking layer BM. In an exemplary embodiment, for example, the second trenches TH2 may overlap with the first to third gate lines GL1, GL2 and GL3 in one-to-one correspondence, as shown in FIG. 5A. Where the second trenches TH2 overlap with the first to third gate lines GL1, GL2 and GL3 in one-to-one correspondence, a first pitch of the second trenches TH2 may be similar to a second pitch of the first to third gate lines GL1, GL2 and GL3. In other exemplary embodiments, the first pitch may be greater than the second pitch. In an exemplary embodiment, for example, the first pitch may be several times to tens of times greater than the second pitch.

In the illustrated exemplary embodiment, the second trenches TH2 may include first sub-trenches TH2-1 defined in the first glass substrate GS1-1 and second sub-trenches TH2-2 defined in the second glass substrate GS2-1. The first sub-trenches TH2-1 may disperse or relieve stress which is applied to the first glass substrate GS1-1 owing to the curved shape of the first glass substrate GS1-1. The second sub-trenches TH2-2 may disperse or relieve stress which is applied to the second glass substrate GS2-1 owing to the curved shape of the first glass substrate GS2-1.

In the illustrated exemplary embodiment, the second trenches TH2 include the first sub-trenches TH2-1 and the second sub-trenches TH2-2. However, the invention is not limited thereto. In other exemplary embodiments, the second trenches TH2 may include only the first sub-trenches TH2-1 defined in the first glass substrate GS1-1 or the second sub-trenches TH2-2 defined in the second glass substrate GS1-1.

Figure 6:
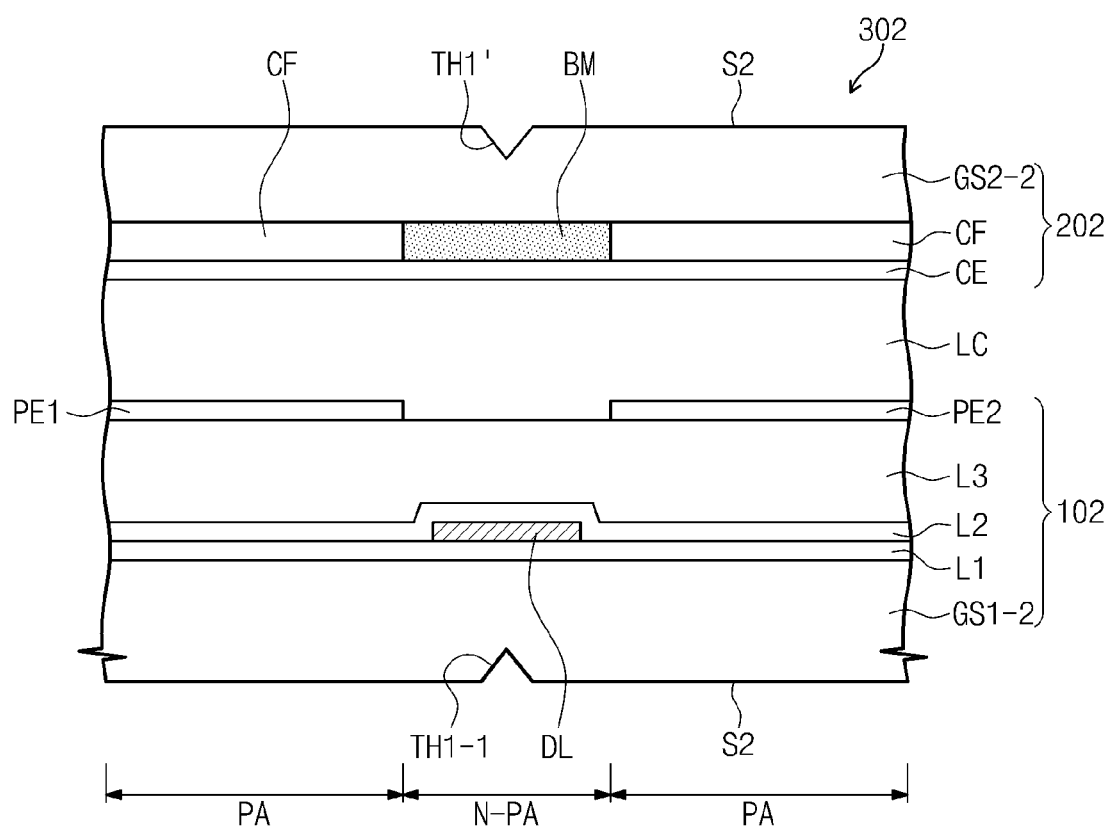
FIG. 6 is a cross-sectional view showing another exemplary embodiment of a display panel included in a curved display device according to the invention.

FIG. 6 is a cross-sectional view of another exemplary embodiment of a display panel included in a curved display device according to the invention. A position of the cross-sectional view of a display panel 302 shown in FIG. 6 corresponds to a position of a cross-sectional view taken along line II-II' of FIG. 2. In the illustrated exemplary embodiment, the same elements as described in the aforementioned exemplary embodiments will be indicated by the same numerals or the same designators. The descriptions to the same elements as described in the aforementioned embodiments will be omitted or mentioned briefly for the purpose of ease and convenience in explanation.

Referring to FIG. 6, the display panel 302 includes a display substrate 102 and an opposite substrate 202. The display substrate 102 includes a first glass substrate GS1-2, and the opposite substrate 202 includes a second glass substrate GS2-2.

In the illustrated exemplary embodiment, each of the first and second glass substrates GS1-2 and GS2-2 has an outer surface S2 exposed outwardly. Each of first trenches TH1' may have a depth taken from the outer surface S2. Even though the first trenches TH1' have a depth from the outer surfaces S2 (not the inner surfaces S1 like in FIG. 3B), stress caused owing to the curved shapes of the first and second glass substrates GS1-2 and GS2-2 may be dispersed or relieved by the first trenches TH1'. As a result, phase retardation of light transmitted through the first and second glass substrates GS1-2 and GS2-2 may be minimized or effectively prevented.

In an exemplary embodiment of manufacturing a curved display device, where the first trenches TH1' are defined at the outer surfaces S2, a laser or an etching solution may be provided to the outer surfaces S2 to form the first trenches TH1' after manufacture of the display panel 302 is completed.

Figure 7:
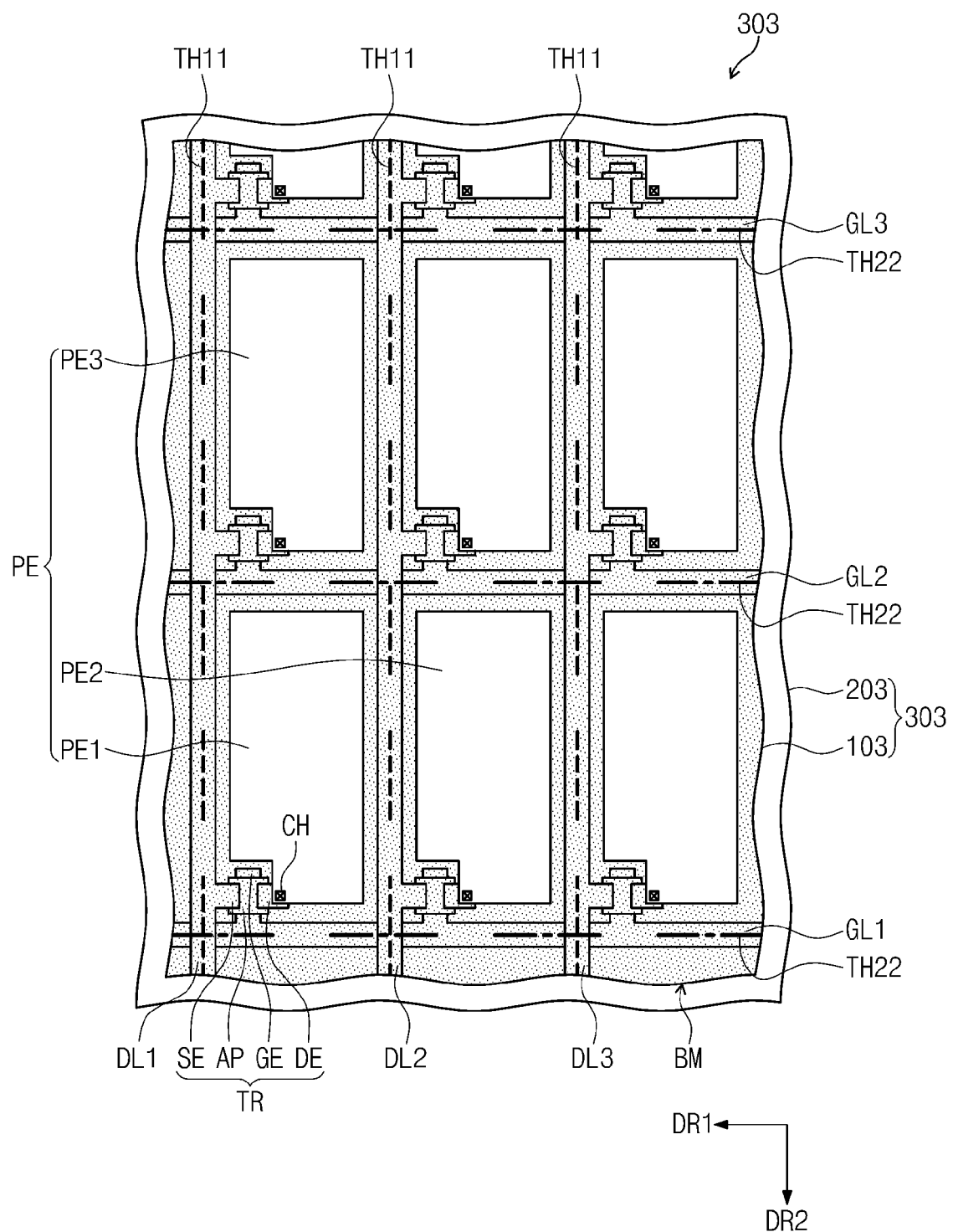
FIG. 7 is an enlarged plan view of another exemplary embodiment of pixels of a display panel included in a curved display device according to the invention.

FIG. 7 is an enlarged plan view of another exemplary embodiment of pixels of a display panel included in a curved display device according to the invention. In the illustrated exemplary embodiment, the same elements as described in the aforementioned exemplary embodiments will be indicated by the same numerals or the same designators. The descriptions to the same elements as described in the aforementioned embodiments will be omitted or mentioned briefly for the purpose of ease and convenience in explanation.

Referring to FIG. 7, a display panel 303 includes a display substrate 103 and an opposite substrate 203. A glass substrate included in the display panel 103 has first trenches TH11 defined therein, and a glass substrate included in the opposite substrate 203 has second trenches TH22 defined therein.

Referring again to FIG. 5A, each of the first trenches TH1 is continuously disposed along the second direction DR2, and each of the second trenches TH2 is continuously disposed along the first direction DR1. In the illustrated exemplary embodiment of FIG. 7, each of the first trenches TH11 is discontinuously disposed along the second direction DR2, and each of the second trenches TH22 is discontinuously disposed along the first direction DR1, as indicated by the separated groups of dotted lines. As used herein, in an area between adjacent groups of dotted lines, the first and second trenches TH11 and TH22 are not defined in the respective glass substrate.

Even though the first and second trenches TH11 and TH22 are discontinuously disposed as described above, the first and second trenches TH11 and TH22 may disperse or relieve stress applied to the display panel 303. In addition, if the stress is locally applied to the display panel 303, the first and second trenches TH11 and TH22 may be selectively defined in portions of the display panel 303 applied with the stress.

Among the display substrate 103 and the opposite substrate 203, while FIG. 7 shows both the first and second trenches TH11 and TH22, the invention is not limited thereto. In an exemplary embodiment, among the display substrate 103 and the opposite substrate 203, one of the first and second trenches TH11 and TH22 may be continuously disposed in one of the respective glass substrates, while the other one of the first and second trenches TH11 and TH22 may be discontinuously disposed in the other one of the respective glass substrates. In another exemplary embodiment, among the display substrate 103 and the opposite substrate 203 and referring again to FIG. 2, one of the first and second trenches TH11 and TH22 may be disposed in one of the respective glass substrates, while no trenches are disposed in the other one of the respective glass substrates.

Figure 8:
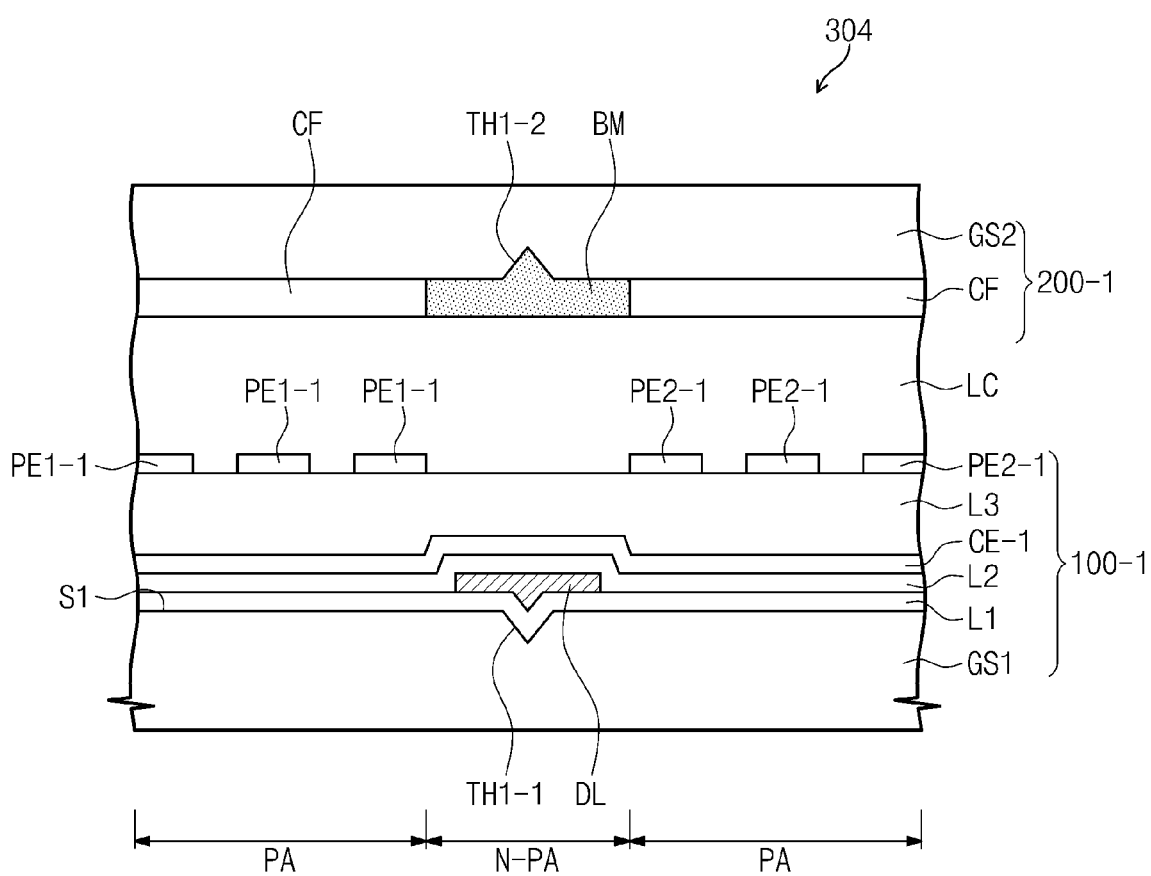
FIG. 8 is a cross-sectional view of yet another exemplary embodiment of a display panel included in a curved display device according to the invention.

FIG. 8 is a cross-sectional view of yet another exemplary embodiment of a display panel included in a curved display device according to the invention. A position of the cross-sectional view of a display panel 304 shown in FIG. 8 corresponds to a position of a cross-sectional view taken along line II-II' of FIG. 2. In the illustrated exemplary embodiment, the same elements as described in the aforementioned exemplary embodiments will be indicated by the same numerals or the same designators. The descriptions to the same elements as described in the aforementioned exemplary embodiments will be omitted or mentioned briefly for the purpose of ease and convenience in explanation.

Referring to FIG. 8, a display panel 304 includes a display substrate 100-1 and an opposite substrate 200-1. Similar to the exemplary embodiment shown in FIG. 3B, the display panel 304 of the illustrated exemplary embodiment includes a first glass substrate GS1 in which first sub-trenches TH1-1 are defined, and the opposite substrate 200-1 includes a second glass substrate GS2 in which second sub-trenches TH1-2 are defined.

Unlike the exemplary embodiment shown in FIG. 3B, the opposite substrate 200-1 of the illustrated exemplary embodiment does not include an electrode for controlling directors of liquid crystal molecules of a liquid crystal layer LC. However, the display substrate 100-1 includes pixel electrodes, and a common electrode CE-1 disposed under the pixel electrodes. The common electrode CE-1 generates an electric field together with the pixel electrodes. In an exemplary embodiment, for example, the pixel electrodes may include a first pixel electrode PE1-1 and a second pixel electrode PE2-1 that face each other with the third insulating layer L3 therebetween. Slits may be defined in each of the first and second pixel electrodes PE1-1 and PE2-1, which define respective portions of the first and second pixel electrodes PE1-1 and PE2-1. The first and second pixel electrodes PE1-1 and PE2-1 having the slits defined therein generate the electric field together with the common electrode CE-1.

In the illustrated exemplary embodiment, the first and second sub-trenches TH1-1 and TH1-2 may disperse or relieve the stress which is locally applied to the first and second glass substrates GS1 and GS2 owing to the curved shape of the display panel 304, and thus, phase retardation of light transmitted through the first and second glass substrates GS1 and GS2 may be minimized or effectively prevented. As a result, the first and second glass substrates GS1 and GS2 may maintain their transparent and non-optical characteristics.

According to one or more exemplary embodiment of the invention, the trenches are defined in the glass substrate and extend in a direction intersecting the curved direction of the glass substrate, in the curved display device. The trenches may disperse or relieve the stress which is locally applied to the glass substrate owing to the curved shape of the glass substrate. Thus, phase retardation of the light transmitted through the glass substrates is minimized or effectively prevented, so the non-optical characteristics of the glass substrates may be maintained to improve the display quality of the curved display device.

While the invention has been described with reference to exemplary embodiments, it will be apparent to those skilled in the art that various changes and modifications may be made without departing from the spirit and scope of the invention. Therefore, it should be understood that the above exemplary embodiments are not limiting, but illustrative. Thus, the scope of the invention is to be determined by the broadest permissible interpretation of the following claims and their equivalents, and shall not be restricted or limited by the foregoing description.

What is claimed is:

1. A curved display device comprising:
   a first substrate curved along a first direction, and comprising a pixel area through which light is transmitted and a non-pixel area which blocks light transmission therethrough;
   a pixel in the pixel area;
   a first signal line provided in plural and connected to the pixel in the pixel area, a length of the first signal line extended in a second direction intersecting the first direction; and
   a second substrate curved along the first direction, and opposite to and coupled to the first substrate,
   wherein
   a first trench is provided in plural in one substrate among the first and second substrates, a length of the first trench extended in the second direction, and
   the first trench of which the length thereof extends in the second direction overlaps the first signal line of which the length thereof extends in the second direction.

2. The curved display device of claim 1, wherein the first trenches are in the non-pixel area.

3. The curved display device of claim 2, wherein the first trenches are defined in the first and second substrates, and comprise:
   first sub-trenches defined in the first substrate; and
   second sub-trenches defined in the second substrate.

4. The curved display device of claim 1, wherein
   each of the first trenches has a first depth from a surface of the one substrate among the first and second substrates, and
   the first depth is in a range of about 10% to about 50% of a thickness of the one substrate among the first and second substrates.

5. The curved display device of claim 1, wherein
   each of the first and second substrates comprises an outer surface exposed outwardly, and an inner surface opposite to the outer surface, and
   the first trenches are defined recessed from the outwardly exposed outer surface of the one substrate among the first and second substrates.

6. The curved display device of claim 1, wherein
   each of the first and second substrates comprises an outer surface exposed outwardly, and an inner surface opposite to the outer surface, and
   the first trenches are defined recessed from the inner surface of the one substrate among the first and second substrates.

7. The curved display device of claim 1, further comprising:
   a second signal line provided in plural and connected to the pixel to which the first signal line is connected, a length of the second signal line extended in the first direction,
   wherein
   the first and second substrates are further curved along the second direction intersecting the first direction,
   a second trench is provided in plural in the one of the first and second substrates among the first and second substrates coupled to each other, a length of the second trench extended in the first direction, and
   the second trench of which the length thereof extends in the first direction overlaps the second signal line of which the length thereof extends in the first direction.

8. The curved display device of claim 7, wherein the second trenches are in the non-pixel area.

9. The curved display device of claim 8, wherein the second trenches are defined in the first and second substrates, and comprise:
   third sub-trenches defined in the first substrate; and
   fourth sub-trenches defined in the second substrate.

10. The curved display device of claim 7, wherein
    each of the second trenches has a first depth from a surface of the one substrate among the first and second substrates, and
    the first depth is in a range of about 10% to about 50% of a thickness of the one substrate among the first and second substrates.

11. The curved display device of claim 7, wherein
    each of the first and second substrates comprises an outer surface exposed outwardly, and an inner surface opposite to the outer surface, and
    the second trenches are defined recessed from at least one of the outer surface and the inner surface of the one substrate among the first and second substrates.

12. The curved display device of claim 7, further comprising:
    a light blocking layer on the first substrate or the second substrate, the light blocking layer overlapping the first trenches and the second trenches.

13. The curved display device of claim 7, wherein the first direction is perpendicular to the second direction.

14. The curved display device of claim 7, wherein an extending direction of each of the first trenches is perpendicular to an extending direction of each of the second trenches.

15. The curved display device of claim 7, further comprising:
    a thin film transistor electrically connected to the pixel;

the second signal line comprising a gate line which is electrically connected to the thin film transistor and through which a gate signal is transferred to the thin film transistor; and the first signal line comprising a data line which is electrically connected to the thin film transistor and through which a data signal is transferred to the thin film transistor, wherein each of the gate line and the data line is provided in plural, the first trenches overlap the plurality of data lines, and the second trenches overlap the plurality of gate lines.

16. The curved display device of claim 7, wherein the first trenches are discontinuous in the first direction; and the second trenches are discontinuous in the second direction.

17. The curved display device of claim 1, wherein the first and second substrates comprise glass substrates.

18. The curved display device of claim 1, further comprising:

a light blocking layer on the first substrate or the second substrate, the light blocking layer overlapping the first trenches.

19. The curved display device of claim 1, further comprising:

a thin film transistor electrically connected to the pixel;

the second signal line comprising a gate line which is electrically connected to the thin film transistor and through which a gate signal is transferred to the thin film transistor; and the first signal line comprising a data line which is electrically connected to the thin film transistor and through which a data signal is transferred to the thin film transistor, wherein each of the gate line and the data line is provided in plural, and the first trenches overlap the plurality of data lines or the plurality of gate lines.

* * * * *